(12) United States Patent
Lin (10) Patent No.: US 7,005,235 B2
(45) Date of Patent: Feb. 28, 2006

(54) METHOD AND SYSTEMS TO PRINT CONTACT HOLE PATTERNS

(75) Inventor: Chin-Hsiang Lin, Hsin-chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 178 days.

(21) Appl. No.: 10/309,427

(22) Filed: Dec. 4, 2002

(65) Prior Publication Data

US 2004/0110092 A1     Jun. 10, 2004

(51) Int. Cl.
    *G03F 7/20*      (2006.01)
(52) U.S. Cl. ........................... 430/311; 430/394
(58) Field of Classification Search ............... 430/311, 430/394
    See application file for complete search history.

(56) References Cited

U.S. PATENT DOCUMENTS

| | | | | |
|---|---|---|---|---|
| 4,402,571 A | * | 9/1983 | Cowan et al. | 204/192.26 |
| 4,517,280 A | * | 5/1985 | Okamoto et al. | 430/321 |
| 4,568,631 A | * | 2/1986 | Badami et al. | 430/315 |
| 5,415,835 A | * | 5/1995 | Brueck et al. | 430/311 |
| 5,759,744 A | | 6/1998 | Brueck et al. | 430/312 |
| 5,958,656 A | * | 9/1999 | Nakao | 430/394 |
| 6,042,998 A | | 3/2000 | Brueck et al. | 430/316 |
| 6,122,037 A | * | 9/2000 | Wagner | 355/67 |
| 6,140,660 A | | 10/2000 | Mermelstein | 250/550 |
| 6,233,044 B1 | | 5/2001 | Brueck et al. | 355/67 |
| 6,709,790 B1 | * | 3/2004 | Gratrix | 430/1 |
| 2002/0106588 A1 | * | 8/2002 | Lai et al. | 430/322 |

FOREIGN PATENT DOCUMENTS

CN            473814            6/1969

* cited by examiner

*Primary Examiner*—Kathleen Duda
(74) *Attorney, Agent, or Firm*—Thomas, Kayden, Horstemeyer & Risley (57) ABSTRACT

A method for forming an arbitrary pattern of sub-micron contact holes in a substrate using a combination of interferometric photolithography and optical photolithography with a non-critical mask. The substrate is covered with a photosensitive material and is exposed by a standing wave interference pattern produced by the superposition of two coherent laser beams. Then the substrate is rotated through 90° and exposed by the same pattern. The double exposure produces a regular array of sub-micron unexposed regions which are all potentially holes if developed. The photosensitive material is then covered by a non-critical photomask and a standard light source is used to exposed those areas of the photosensitive material containing unwanted holes. Upon final development, the desired pattern is obtained.

21 Claims, 6 Drawing Sheets

$$\frac{\lambda}{2}\sin\theta$$

METHOD AND SYSTEMS TO PRINT CONTACT HOLE PATTERNS

BACKGROUND OF THE INVENTION

1. Field of the Invention

This invention relates generally to the field of semiconductor processing and more particularly to an interferometric photolithography method for producing contact hole patterns in photosensitive material.

2. Description of the Related Art

The fabrication of microelectronic integrated circuitry generally involves the patterning of device structures and layouts on a semiconductor substrate. The accepted practice for creating the requisite pattern is to first form a replica of the pattern on a mask (not necessarily in its final size) and then to transfer the mask pattern to a layer of photoresistive material (positive or negative photoresist being acceptable) formed on the semiconductor substrate. The transfer is accomplished by an optical photolithographic process, shining light of a certain wavelength through the mask and onto the photoresist, using whatever optical lenses are required to replicate the pattern in its proper size on the photoresist. Once the pattern has been transferred to the photoresist, the photoresist is processed to selectively remove portions of the pattern and expose the substrate below. The substrate, itself, can then be etched by, for example, an anisotropic plasma etch, or otherwise processed as required.

With the progressive shrinking of device sizes to as small as tenths of a micron, the dimensions of patterns to be transferred by optical photolithography are approaching the wavelengths of the optical radiation being used to effect the transfer. As this occurs, maintaining both a high pattern resolution and a depth of field sufficient to allow precise focusing on a substrate of imperfect planarity becomes a serious problem that requires the use of sophisticated mask designs, such as phase shifting masks. Another way of avoiding this problem, at least when the pattern to be transferred has a certain appropriate shape or periodicity, is by the use of interferometric photolithography rather than optical lithography. In interferometric lithography the pattern is directly formed by the standing wave interference pattern of two or more coherent optical beams rather than by the use of transmissive or reflective optical systems to form images of patterns in masks by the focusing of light rays. In short, the interference pattern becomes the transferred pattern. Two advantages of this approach are: 1) the dimensions of patterns that can be produced by wave interference is on the order of fractions of a wavelength and 2) the lack of lens focusing eliminates the problem of depth of field. A disadvantage of this approach is that only patterns produced by wave interference can be transferred to a substrate, thus limiting the selection of transferable patterns.

One type of pattern that can be quite appropriately formed by interferometric methods is a pattern of small holes such as those used for forming vias in VLSI circuitry. Brueck et al. (U.S. Pat. No. 5,759,744) discloses a method for forming a regular array of holes by crossing (at 90°) two patterns of linear interference fringes produced by intersecting laser beams. The intersections of the fringes produce a light intensity of sufficient strength to develop a layer of photoresist and form the regular array. In an attempt to improve the diversity and resolution of images produced by interferometric photolithography, Brueck et al (U.S. Pat. No. 6,042,998) disclose a method for extending the available spatial frequency content of an image by layering a plurality of interferometrically produced patterns in different photoresist layers. Again, Brueck et al., in (U.S. Pat. No. 6,233,044) disclose a method of combining optical and interferometric photolithography, wherein the interferometric part images the high frequency components of the pattern and the optical part images the low frequency components. Finally, Mermelstein (U.S. Pat. No. 6,140,660) discloses a method for interferometrically forming a non-periodic pattern by means of a synthetic aperture system, which is a plurality of beams controlled by a plurality of beam controllers, which together can create arbitrary overlaps and corresponding interference patterns.

Although the patents cited above offer an indication of the usefulness of interferometric photolithography, with the exception of U.S. Pat. No. 5,759,744 of Brueck et al., the techniques disclosed are highly complex. On the other hand, the aforementioned method of Brueck is applicable only to the patterning of a regular pattern of holes, so it is fairly limited in its scope. The purpose of the present invention is to provide a method of using interferometric photolithography that is both simple and applicable to a wider range of patterns.

SUMMARY OF THE INVENTION

A first object of this invention is to provide a method for forming an interferometric photolithographic pattern having sub-micron resolution.

A second object of this invention is to provide a method for forming such an interferometric photolithographic pattern while using either a positive or negative photoresistive medium.

A third object of this invention is to provide a method for forming an interferometric photolithographic pattern suitable for creating a regular dense array of holes, a regular semi-dense or sparse array of holes, a random distribution of holes or isolated holes without the optical proximity effect.

The objects of this invention are achieved by forming a standing wave interference pattern (a pattern of interference fringes) on a photoresistive material (positive or negative type) that has been deposited on a substrate. The pattern is formed through a succession of exposures, prior to each of which the position of the photoresist-covered substrate may be rotated relative to its position in the previous exposure, producing, thereby, a multiple superposition of individual exposures. This multiply exposed photoresistive medium is thereupon covered by a non-critical mask (a mask not requiring sophisticated optical design such as phase shifts or requiring an optical proximity correction) having opaque and transparent regions, the opaque regions having the shape of the desired final pattern (for a negative type photoresist). When light of the proper intensity impinges upon the mask, it penetrates only the transparent region, fully exposing that region while leaving the remaining portion of the pattern untouched. The mask is then removed and the negative photoresistive medium is developed, removing the unexposed region.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENTS

First Preferred Embodiment

The first preferred embodiment of this invention provides a method of forming an interferometric pattern of submicron holes by means of a triple exposure of a photosensitive material using a first beam splitting apparatus (FIG. 1) of novel design. While it is recognized that there are several types of photosensitive materials that will achieve the objects of the invention, the preferred embodiment uses a photoresistive material, or photoresist. The first exposure is produced by a standing wave interference pattern between coherent laser beams produced by splitting and recombining a single laser beam (the x-direction pattern); the second exposure is produced by the same standing wave pattern, but with the photosensitive material now rotated through 90° about a vertical axis relative to the first exposure (the y-direction pattern) so that the second exposure is superimposed upon the first to form a regular array; the third exposure is produced by a uniform light source passing through a non-critical mask (which may include a non-critical stepper or scanner) formed to delineate those regions of the photoresistive material which are to retain the pattern and to permit elimination of the pattern from regions where it is not desired. Finally, the photoresistive material is developed by methods consistent with the type of photoresistive material being used and the final pattern of holes is obtained. It is to be noted that the method of the first preferred embodiment is not limited in scope to patterns produced by only a triple exposure. A multiplicity of interferometric patterns may be produced at different relative angles of the substrate to produce a more complex final pattern.

Figure 1:
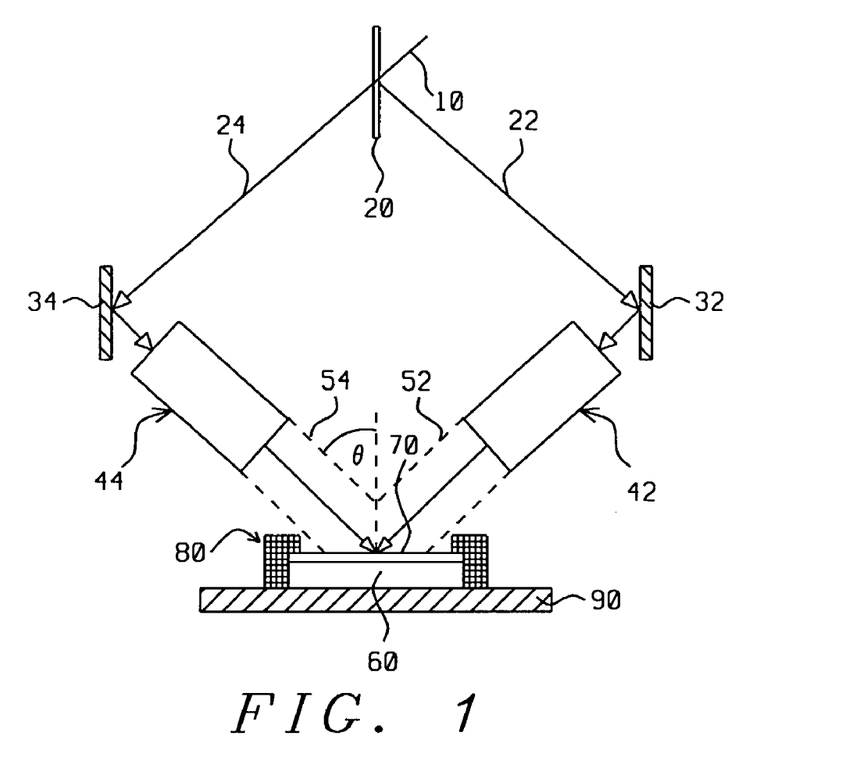
FIG. 1 is a schematic diagram of a first type of apparatus suitable for producing an interference pattern (a pattern of interference fringes) on a photoresistive material in accord with a first embodiment of the present invention.

Referring first to FIG. 1, there is shown a schematic diagram of a first apparatus that can be used to form a standing wave interference pattern between two coherent light beams in accord with the objects of this invention. A single incident beam of light (10), such as that produced by a laser or other source of monochromatic light having a high degree of spatial and temporal coherence, is incident on a beam splitter (20). The reflected (22) and transmitted (24) beams are directed at reflecting surfaces (32 &34), which are preferably planar mirrors, from which they are reflected and caused to pass through optical beam expanders (42 & 44) (described below with reference to FIG. 2) producing final beams (52 & 54) of sufficient uniformity and cross-section to create the desired interference pattern. The final beams (52 & 54) thereupon strike a substrate (60) covered with a photoresistive material (70), each beam making an angle θ with the normal to the substrate. The substrate is held in place within an alignment module (80) which is mounted upon a rotatable stage (90). The angle θ is critical to the distance between fringes and to the width of the fringes within the interference pattern and can be adjusted by means of the mirrors (32 & 34).

Figure 2:
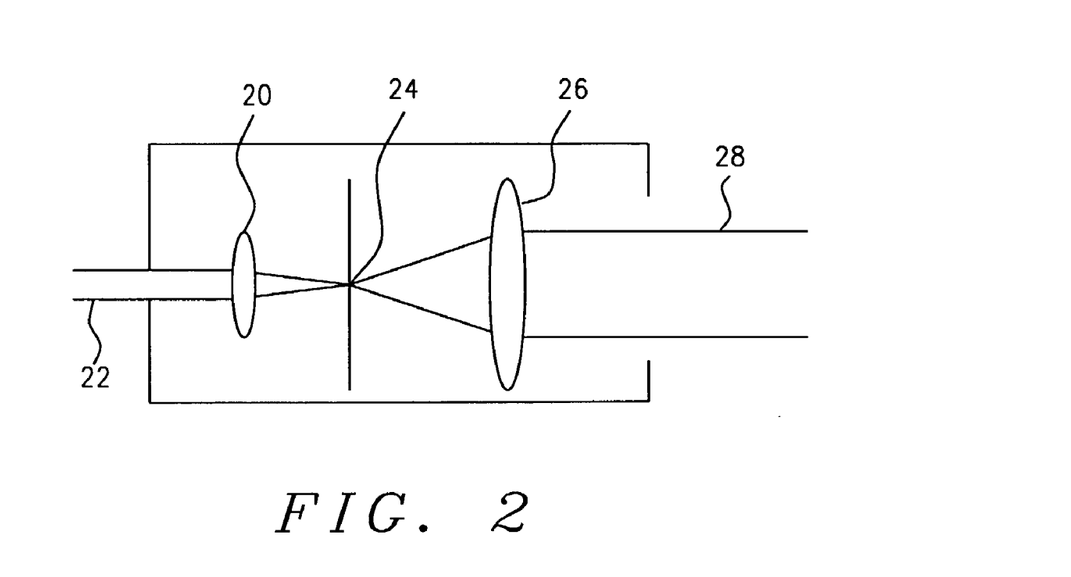
FIG. 2 is a schematic diagram of an optical beam expander used in the apparatus of FIGS. 1 and 3.

Referring next to FIG. 2, there is shown an internal view of the beam expander at (42) and (44) of FIG. 1, indicating its optical components. A first converging lens (20) focuses the entering laser beam (22) onto a pinhole (24) which is located at the focal point of a second converging lens (26). Since the pinhole is essentially a point source of light for the second lens (26), that lens produces an emergent beam of parallel light (28). The diameter of the emerging beam is significantly greater than that of the incident beam because of the size of the second lens.

Figure 3:
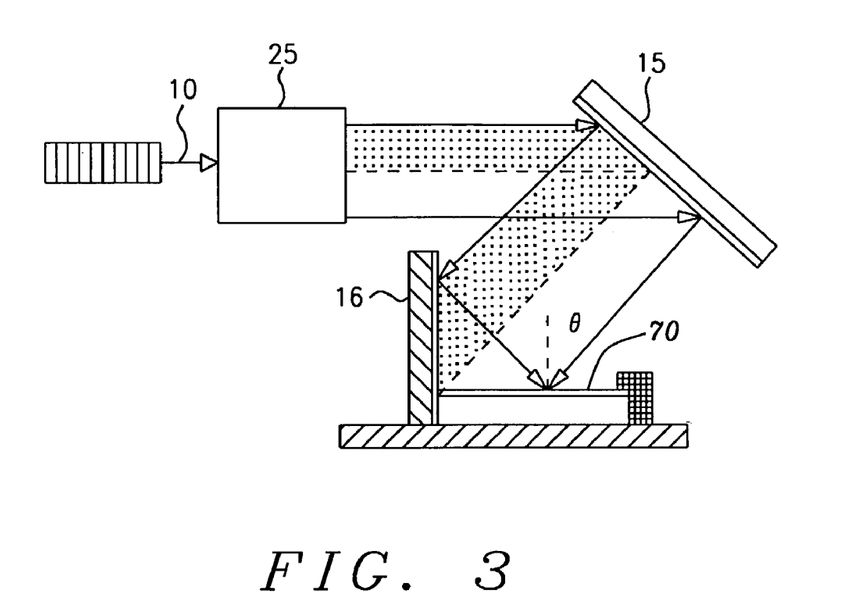
FIG. 3 is a schematic diagram of a second type of apparatus suitable for producing an interferometric pattern on a photoresistive material in accord with a second embodiment of the present invention.

Referring next to FIG. 3 there is shown a second apparatus for producing the same interferometric effect as that in FIG. 1, except that the entering beam (10) is not split and only a single beam expander (25) is used. This apparatus has a smaller footprint and may be preferable in environments where the size of the apparatus is a constraining factor. The mirrors (15 & 16) are not symmetrically arranged as in the apparatus of FIG. 1 and the entire apparatus may be suitable for different manufacturing arrangements than that in FIG. 1. Typically, mirror (16) is fixed, whereas mirror (15) can be rotated. As is seen in the figure, an upper portion (shaded) of the expanded beam incident on mirror (15) reflects from that mirror onto mirror (16). This shaded portion of the beam thereupon interferes with the unshaded portion in the region where both combine on the substrate's photosensitive layer (70). The use of this apparatus constitutes a second embodiment of the invention.

Figure 4:
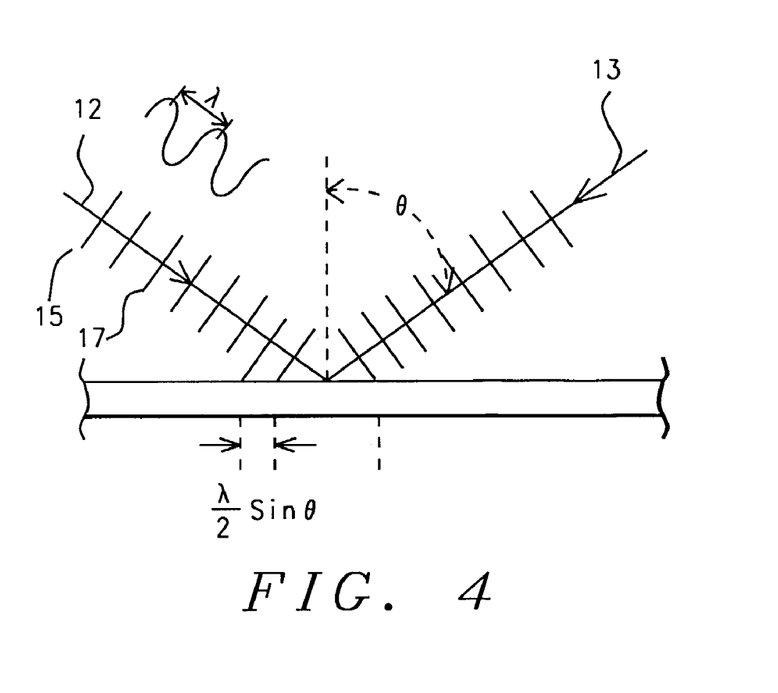
FIG. 4 is a schematic diagram showing symbolic wavefronts of the interfering beams and indicating how the angle of their incidence determines the spacing of the interference fringes.

Referring next to FIG. 4, there is shown a schematic representation of the forming of interference fringes (interference maxima) as a result of the superposition of two coherent laser beams (12 & 13) impinging upon a planar surface at an angle θ to the normal of that surface. The parallel lines indicate wavefront intensity maxima (15) and minima (17) of the beams, which can be assumed to be plane waves. The distance between successive maxima or minima is the wavelength, λ, of the wave. When a maximum (minimum) of one wave overlaps a maximum (minimum) of the other wave on the surface, the intensity of the superposition is maximized (constructive interference) and a fringe is formed. When a maximum overlaps a minimum, the intensity approaches zero and destructive interference occurs. In FIG. 5, described below, the fringes are indicated as dark lines, while the regions of destructive interference are indicated as unshaded areas. As can be deduced from the geometry, the center-to-center distance between two successive fringes is the "grating pitch" Λ, which is given by: $\Lambda = \lambda/2 \sin\theta$. The width of a fringe or of the space between fringes is $\Lambda/2$.

Figure 5A:
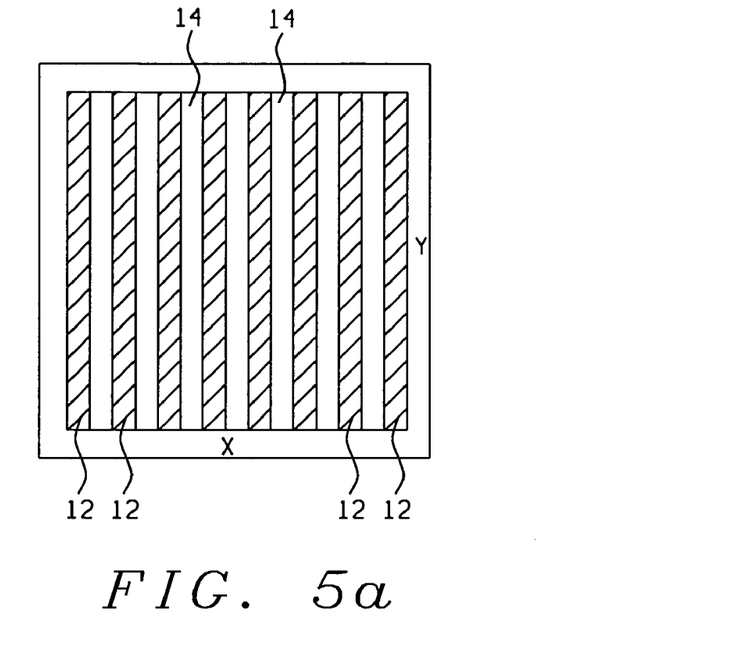
FIGS. 5a and b are schematic diagrams showing (a) an x-direction interference pattern and (b) the superposition of an x-direction and y-direction pattern.

Referring next to FIG. 5a, there is shown a schematic diagram of an interference pattern such as would be formed on the photoresist-covered substrate shown in FIG. 1 or 3 in accord with the method of this invention. This pattern would correspond to a first photoresist exposure, prior to rotating the substrate. The dark lines (12) are the regions of constructive interference and maximum light intensity, the unshaded lines between them (14) are the regions of destructive interference and minimum light intensity. For typical laser wavelengths currently in use of (approximately) $\lambda=248$ nm (nanometers), 193 nm or 157 nm, the width of the dark or light lines would be nearly ¼ of a wavelength, respectively, 64 nm, 48 nm and 39 nm, as $\theta$ approached 90°. This small size allows the formation of correspondingly small features in the photoresist.

Figure 5B:
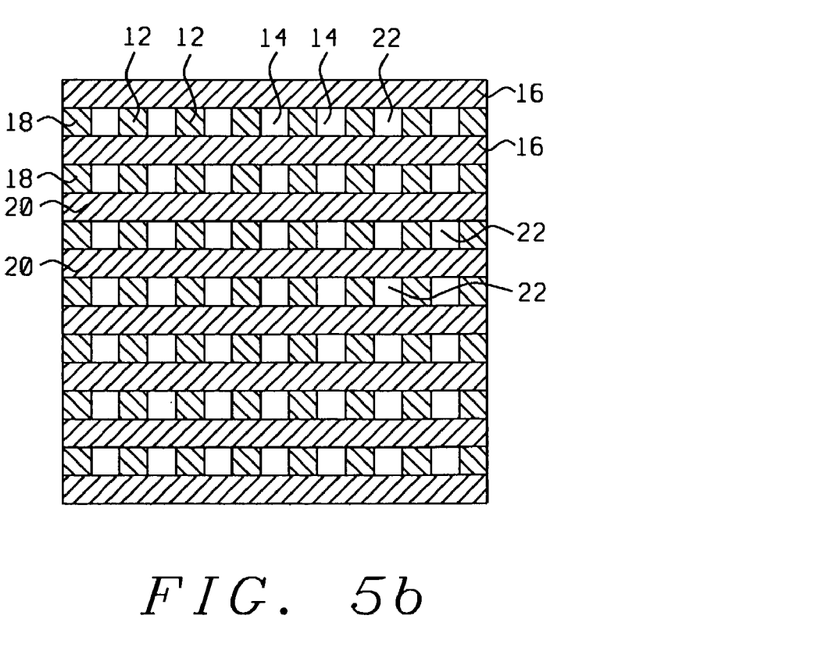

FIG. 5b shows the result of rotating the substrate through 90° and superimposing upon the first pattern a second interference pattern, identical to the first, which will be called the y-direction pattern. The lines of maximum (16) and minimum (18) intensity formed on the rotated substrate intersect the original lines (12 & 14) at 90° angles. The regions at which two dark lines intersect (20) are regions at which the photoresist is subjected to its maximum exposure. The remaining totally unshaded regions (22) are regions at which the photoresist is totally unexposed. When the photoresist is of the negative type, as in this case, subsequent development would remove unexposed areas. If the process were terminated at this point, therefore, and the photoresist were developed, a symmetric and regular array of holes would be produced at the unexposed locations of photoresist (22). These holes would allow corresponding holes to be formed in the substrate. The novelty of this method includes the steps described below, however, which allows the development of only a selected portion of the regular pattern of unexposed regions to be developed.

Figure 6A:
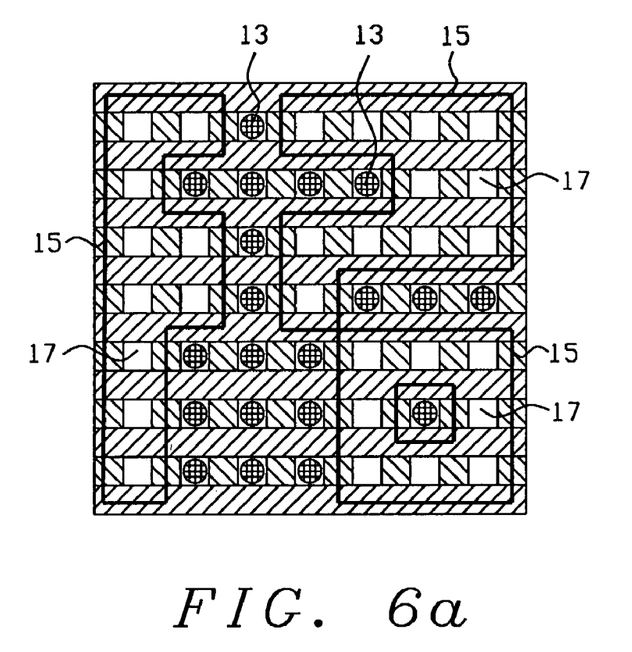
FIGS. 6a, b and c is a schematic diagram showing: (a) a design pattern superimposed on the intersecting interference patterns so as to delineate the region of desired holes; (b) a non-critical mask designed so as to produce said pattern on the photoresist and (c) the mask placed on the photoresist.

Referring next to FIG. 6a, there is shown the design of a non-critical mask that is appropriate to producing a final set of desired holes from the crossed interference patterns of FIG. 5. The dark circles (13) drawn in the unexposed regions represent the desired final hole locations. The linear pattern (15) is the pattern of the mask shape required to produce those final holes by protecting them from exposure and, correspondingly, to expose the regions which would become unwanted holes (17). It is to be noted that role of the mask is to retain the desired portions of the array of interferometrically produced holes. It is, therefore, within the objects of the present invention to use masks of different types, including transparent and opaque optical masks, photostepping devices (photosteppers) and scanning devices. It is also possible to use masks that are placed on the substrate or above the substrate. Since the masks are non-critical, optical proximity correction need not be made.

Figure 6B:
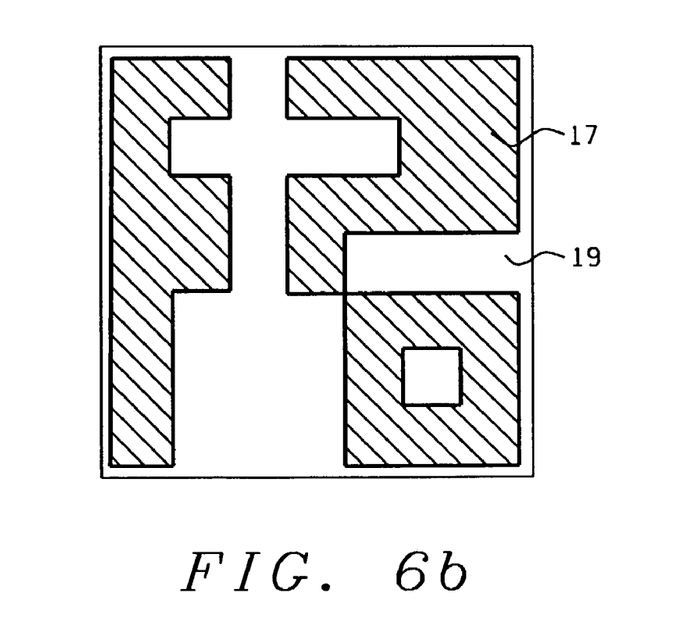

FIG. 6b is a schematic representation of the mask designed in accord with the pattern of FIG. 6a. The dark region (17) is a region of transparency, the light region (19) is an opaque region, typically formed of chrome.

Figure 6C:
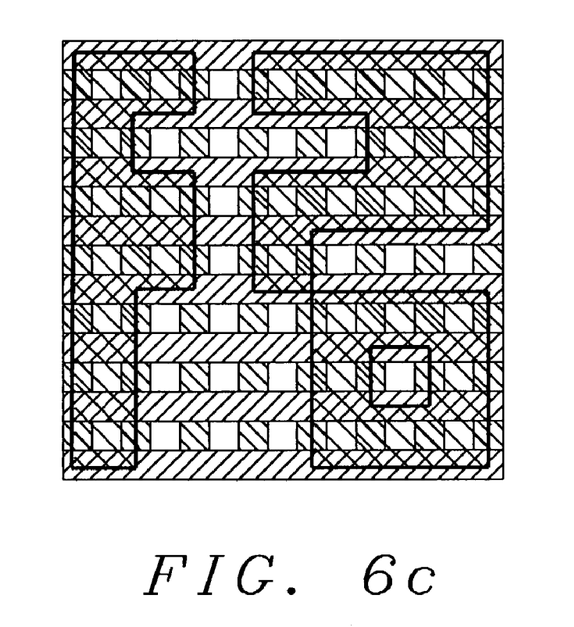

FIG. 6c shows, schematically, the placement of the mask of FIG. 6b over the photoresist. A final exposure of the photoresist through the mask, using conventional (non-interferometric) exposure methods will now be applied.

Figure 7:
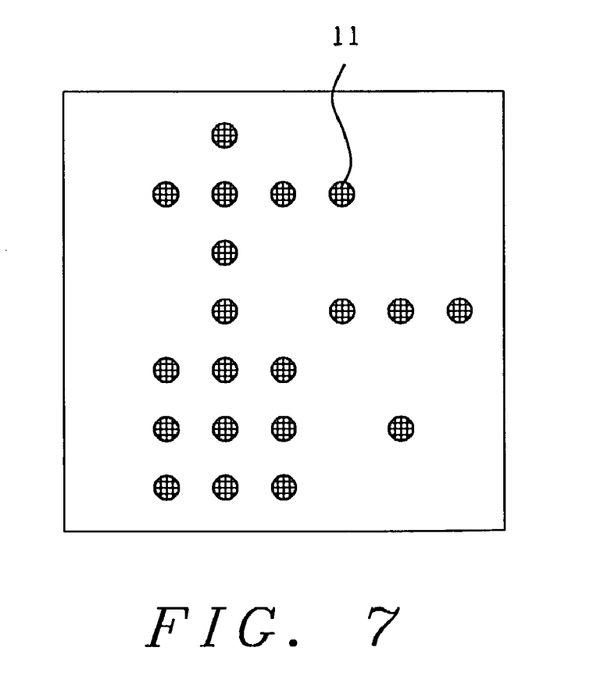
FIG. 7 is a schematic diagram of the developed photoresistive medium (assumed negative), subsequent to the masking of FIG. 6 and additional conventional photoexposure, showing the creation of the remaining holes which constitute the desired pattern to be reproduced in the substrate.

Referring now to FIG. 7, there is shown the photoresist subsequent to its development. Assuming a negative photoresist medium, the unexposed areas, being more soluble, have been removed by the development process, leaving the desired holes (dark circles) (11) in their place. The less soluble exposed areas beneath the mask openings contained all the previously unexposed regions that would have produced unwanted holes in the final pattern. In actual practice, an array of 0.22 micron holes was obtained using a laser wavelength of approximately 457.9 nm.

Figure 8A:
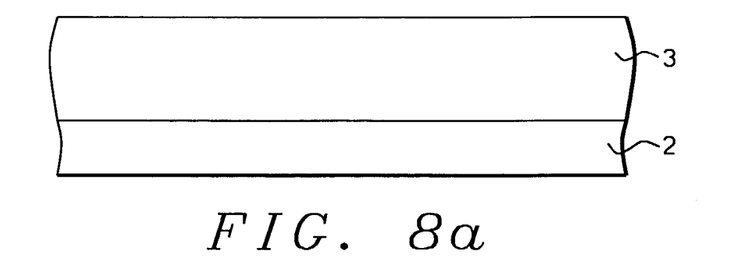
FIGS. 8a, b, c and d is a representation of the steps in FIGS. 6 and 7 above for a positive photoresist.
Figure 8B:
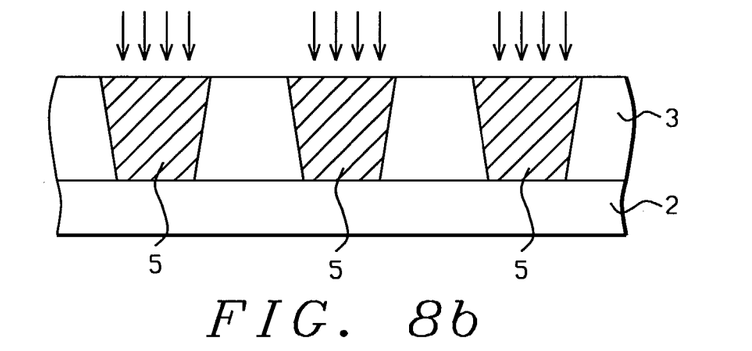
Figure 8C:
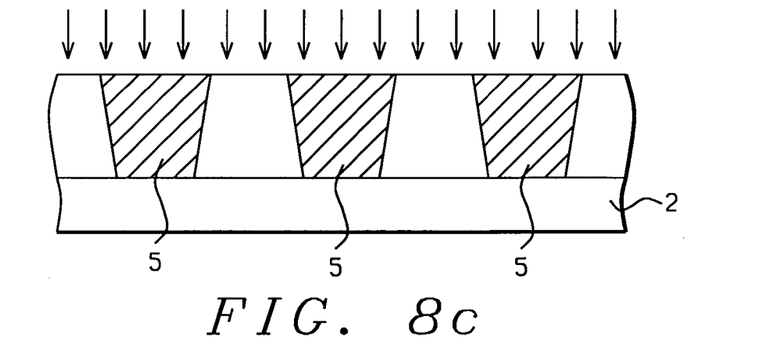
Figure 8D:
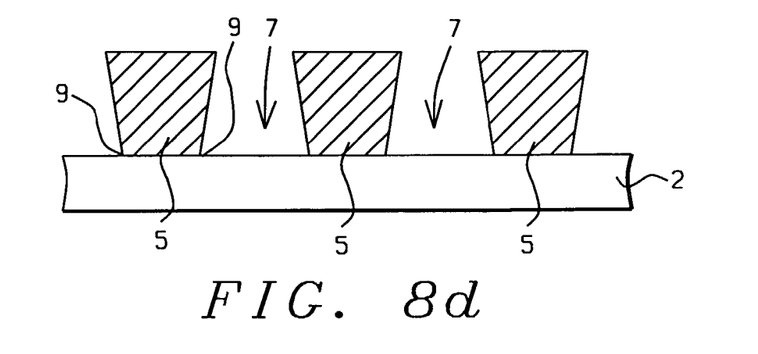

Referring finally to FIG. 8a, there is schematically shown an alternative application of the present invention in which a molecularly cross-linked positive photoresist is used. This specially prepared photoresist can be developed to produce a reversed image from that of a normal positive photoresist by post-baking the resist after the patterned exposure to produce the cross-linkages and then flooding the photoresist with UV-light. FIG. 8a shows a side cross-sectional view of a substrate (2) on which has been deposited by a method such as spin coating a positive photoresist (3) (typically HPR204 made by Fuji-Olin) to which has been added approximately 3% imidazole by weight. The coated substrate is then prebaked at approximately 85° C. for approximately 20 min. FIG. 8b shows incident radiation (arrows) forming exposed regions (5) in a pattern such as would be produced interferometrically by the method of the present invention. The patterned photoresist is then been post-baked for approximately 30 min. at approximately 100° C. to cross-link the exposed resist. FIG. 8c shows the post-baked photoresist being subjected uniformly to UV-light (arrows), rendering the already exposed region (5) very insoluble under the subsequent development process. FIG. 8d finally shows the developed photoresist with the unexposed portion (7) of the photoresist removed and an undercut profile of the remaining portion (9) being formed.

Second Preferred Embodiment

A second preferred embodiment of the present invention would differ from the first preferred embodiment only in the use of the beam-splitting apparatus of FIG. 3 instead of the apparatus of FIG. 1. In all other respects the method of the present invention would be practiced in accord with the discussion of FIGS. 2, 4, 5, 6, 7 and 8 and the objects of the present invention would be identically achieved. The use of the apparatus of the second embodiment could be advantageous under certain constraints of the manufacturing environment, particularly circumstances requiring a minimum footprint of the device.

As is understood by a person skilled in the art, the preferred embodiments of the present invention are illustrative of the present invention rather than limiting of the present invention. Revisions and modifications may be made to methods, materials, structures and dimensions employed in the present method of using interferometric photolithography combined with optical lithography with a non-critical mask to create patterns of sub-micron holes in a substrate while still being in accord with the spirit and scope of the present invention as defined by the appended claims.

What is claimed is:

1. A method combining interferometric and optical photolithography for producing, in a substrate, an arbitrary pattern of sub-micron holes from an array of such holes comprising:

providing a substrate covered with a photosensitive material;

exposing said substrate with a first radiative exposure using a first standing wave interference pattern produced by a superposition of coherent beams of electromagnetic radiation;

exposing said substrate, subsequent to said first exposure, with at least a second radiative exposure using a second standing wave interference pattern produced by a superposition of coherent beams of electromagnetic radiation and creating, thereby, an interferometric array of exposed and unexposed regions in said photosensitive material, from which unexposed regions will be formed the selected pattern of holes;

placing a non-critical mask above said substrate and exposing said mask and substrate to a uniform flux of electromagnetic radiation such that said radiation passes through the transparent portion of said mask and exposes a corresponding portion of the photosensitive material on the substrate;

developing said photosensitive material, removing, thereby all remaining unexposed areas of said material which now comprise the areas beneath the opaque portion of the mask that were unexposed before placement of the mask;

wherein the interference producing superposition is formed by sending a single laser beam through a beam expander, reflecting said expanded beam from a first reflecting surface such that a lower portion of said reflected beam strikes the substrate while an upper portion of said beam strikes a second reflecting surface that is perpendicular to said substrate and which reflects said upper portion also onto the substrate, the lower and upper portions now making equal angles with the normal to the substrate and being symmetrically disposed about said normal.

2. The method of claim 1 wherein the photosensitive material is a negative photoresist.

3. The method of claim 1 wherein the photosensitive material is a positive photoresist that has been treated with a molecular cross-linking agent.

4. The method of claim 3 wherein the molecularly cross-linked positive photoresist is pre-baked before the exposures, then is post-baked after exposure and is further subjected to exposure by UV radiation to render all exposed areas insoluble within the development process.

5. The method of claim 1 wherein the coherent beams of radiation are formed from a laser beam.

6. The method of claim 1 wherein the beam expander comprises a pinhole placed between a first converging lens and a second converging lens, which second lens is coplanar with the first and of a larger diameter than the first and wherein the lenses are positioned with the pinhole approximately at the common focal point of each lens.

7. The method of claim 1 wherein the laser beam has a wavelength of approximately 248 nm.

8. The method of claim 1 wherein the laser beam has a wavelength of approximately 193 nm.

9. The method of claim 1 wherein the laser beam has a wavelength of approximately 157 nm.

10. The method of claim 1 wherein there are only 2 standing wave exposures.

11. The method of claim 10 wherein the second standing wave exposure is made subsequent to rotating the substrate by an angle of 90° about the normal to its surface.

12. The method of claim 1 wherein the non-critical mask is an optical mask comprising optically opaque regions and optically transparent regions, said opaque regions corresponding to the desired pattern of holes to be formed in the substrate.

13. The method of claim 1 wherein the non-critical mask is provided by a photostepping apparatus.

14. The method of claim 1 wherein the non-critical mask is provided by a scanning apparatus.

15. A method combining interferometric and optical photolithography for producing, in a substrate, an arbitrary pattern of sub-micron holes from an array of such holes comprising:

providing a substrate covered with a photosensitive material;

exposing said substrate with a first radiative exposure using a first standing wave interference pattern produced by a superposition of coherent beams of electromagnetic radiation;

exposing said substrate, subsequent to said first exposure, with at least a second radiative exposure using a second standing wave interference pattern produced by a superposition of coherent beams of electromagnetic radiation and creating, thereby, an interferometric array of exposed and unexposed regions in said photosensitive material, from which unexposed regions will be formed the selected pattern of holes;

placing a non-critical mask above said substrate and exposing said mask and substrate to a uniform flux of electromagnetic radiation such that said radiation passes through the transparent portion of said mask and exposes a corresponding portion of the photosensitive material on the substrate;

developing said photosensitive material, removing, thereby all remaining unexposed areas of said material which now comprise the areas beneath the opaque portion of the mask that were unexposed before placement of the mask;

wherein the interference producing superposition is formed by sending a single laser beam though a beamsplitter, directing the two beams thus formed to reflecting surfaces, passing each reflected beam through a beam expander and then recombining the two expanded beams at the surface of the photoresist such that each makes the same angle symmetrically disposed to either side of a normal to the surface of the photoresist; and wherein the laser beam has a wavelength less than 157 nm.

16. The method of claim 15 wherein the beam expander comprises a pinhole placed between a first converging lens and a second converging lens, which second lens is coplanar wit the first and of a larger diameter than the first and wherein the pinhole is approximately at the common focal point of each lens.

17. A method combining interferometric and optical photolithography for producing, in a substrate, an arbitrary pattern of sub-micron holes from an array of such holes comprising:

providing a substrate covered with a photosensitive material;

exposing said substrate with a first radiative exposure using a first standing wave interference pattern produced by a superposition of coherent beams of electromagnetic radiation;

exposing said substrate, subsequent to said first exposure, with at least a second radiative exposure using a second standing wave interference pattern produced by a superposition of coherent beams of electromagnetic radiation and creating, thereby, an interferometric array of exposed and unexposed regions in said photosensitive material, from which unexposed regions will be formed the selected pattern of holes;

placing a non-critical mask above said substrate and exposing said mask and substrate to a uniform flux of electromagnetic radiation such that said radiation passes through the transparent portion of said mask and exposes a corresponding portion of the photosensitive material on the substrate;

developing said photosensitive material, removing, thereby all remaining unexposed areas of said material which now comprise the areas beneath the opaque portion of the mask that were unexposed before placement of the mask;

wherein the interference producing superposition is formed by sending a single laser beam through a beam-splitter, directing the two beams thus formed to reflecting surfaces, passing each reflected beam through a beam expander and then recombining the two expanded beams at the surface of the photoresist such that each makes the same angle symmetrically disposed to either side of a normal to the surface of the photoresist;

wherein there are only two standing wave exposures; and wherein the second standing wave exposure is made subsequent to rotating the substrate by an angle of 90° about the normal to its surface.

18. The method of claim 17 wherein the laser beam has a wavelength of approximately 248 nm.

19. The method of claim 17 wherein the laser beam has a wavelength of approximately 193 nm.

20. The method of claim 17 wherein the laser beam has a wavelength of approximately 157 nm.

21. The method of claim 17 wherein the laser beam has a wavelength less than 157 nm.

* * * * *